Figure 1:
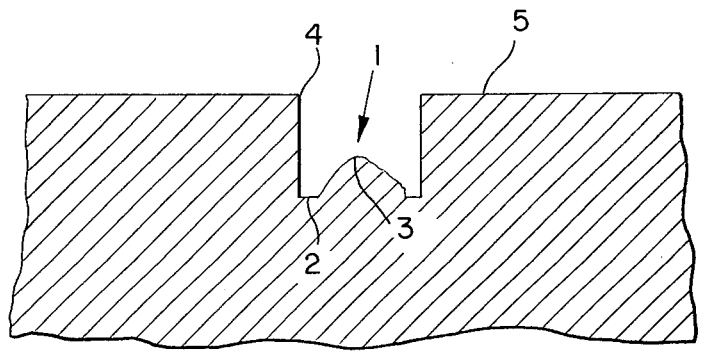

United States Patent

Hepp et al.

[11] 3,954,582
[45] May 4, 1976

[54] PROCESS FOR PRODUCING GROOVES IN METALLIC BODIES

[75] Inventors: Wolfgang Hepp, Immenstaad; Klaus Pimiskern, Friedrichshafen; Werner Herbert, Markdorf, all of Germany

[73] Assignee: Dornier System GmbH, Germany

[22] Filed: Feb. 24, 1975

[21] Appl. No.: 552,270

Related U.S. Application Data

[63] Continuation-in-part of Ser. No. 373,258, June 25, 1973, abandoned.

[30] Foreign Application Priority Data

Aug. 11, 1972 Germany............................ 2239639

[52] U.S. Cl................................ 204/129.65; 156/8
[51] Int. Cl.² ...................... B29C 17/08; C25F 3/00
[58] Field of Search .............. 204/129.65; 156/8, 18

[56] References Cited
UNITED STATES PATENTS

| | | | |
|---|---|---|---|
| 2,848,401 | 8/1958 | Hartley | 204/129.65 |
| 3,179,543 | 4/1965 | Marcelis | 204/129.65 |
| 3,453,159 | 7/1969 | Vandersteen | 156/8 |
| 3,560,357 | 2/1971 | Shaw | 204/129.65 |
| 3,843,501 | 10/1974 | King | 204/129.65 |

*Primary Examiner*—T. M. Tufariello
*Attorney, Agent, or Firm*—James E. Bryan

[57] ABSTRACT

This invention relates to a process for producing helical oil grooves in a spherical metallic body, for example for a spiral groove bearing, which comprises exposing a photographic lacquer on the surface of said body to light under a pattern, developing the resulting image, and electrochemically etching and then chemically etching grooves in said body in the non-image areas, whereby pressure-building spiral grooves are produced having a planar groove bottom, straight walls, sharply right-angled edges, and a depth in the range of about 1 to 20 microns.

1 Claim, 3 Drawing Figures

PROCESS FOR PRODUCING GROOVES IN METALLIC BODIES

This application is a continuation-in-part of application Ser. No. 373,258, filed June 25, 1973, now abandoned.

The present invention relates to a process for producing grooves or notches in metallic bodies, such as are employed, for example, in spiral groove bearings which find use in high-speed devices.

In spiral groove bearings, lubricant is conveyed — due to the feeding effect of the grooves — to the center of the bearing and therewith a pressure is built up between the bearing gliding surfaces. The supporting or carrying capacity of such bearings depends essentially upon the amount of the lubricant pressure produced. Particularly, however, a rapid build-up of the lubricant pressure is very important in the starting state or condition of the bearing so that a direct frictional contact between the bearing gliding surfaces arises only for as short a period of time as possible, since wear and tear will otherwise be produced at the bearing gliding surfaces and will greatly reduce the service or useful life of such bearings.

The spirally-extending grooves or notches are produced in a manner known per se by exposure to light of a gliding surface coated with a photographic lacquer, and by a subsequent chemical milling or cutting. Produced as a result are grooves or notches whose configuration is in accordance with the pattern projected and which, while having a sufficiently accurate contour, includes in the center of the groove or notch bottom an elevation of material, or which produces a transition between the groove wall and the gliding surface that is uneven and often rounded off. The conveying or feeding effect of the lubricant through the grooves during the operation of the bearing depends, however, particularly upon an optimal groove cross-section being maintained. Deviations which result from the manufacturing process thus lead to a reduced supporting or carrying capacity of the bearing.

Other known manufacturing processes for producing grooves make use of templates which leave the groove pattern that is chemically cut free on the bearing gliding surface. The disadvantages referred to hereinabove will arise, however, also in connection with these manufacturing processes.

Known in the art are further processes for manufacturing grooves or notches which allow for preparing or providing for a groove by the erosive removal of material from the bearing gliding surface. These processes have been found to be very expensive and suitable only for specific sizes and shapes of bearings.

It is the object of the present invention to avoid the disadvantages and drawbacks of the known manufacturing processes as outlined hereinabove and to provide grooves or notches in metallic bodies which have an exact as possible geometrical cross-sectional shape or configuration.

This object is obtained, in accordance with the present invention, by virtue of the fact that the surface of the body, provided in a manner known per se with photographic lacquer and exposed to light, is electrochemically, and subsequently chemically, etched.

This process results in grooves whose geometric cross-sectional configuration corresponds exactly to the predetermined cross-sectional shape. As a result thereof, a good lubricating film effect will be present in oil grooves during the starting state or condition and during the operation of the bearing.

Figure 2:
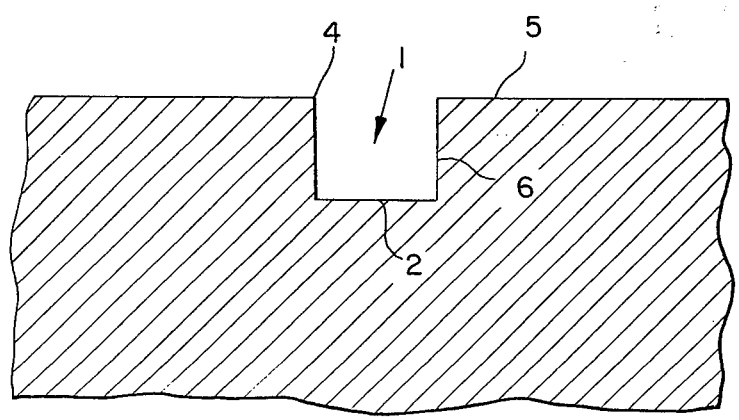
Figure 3:
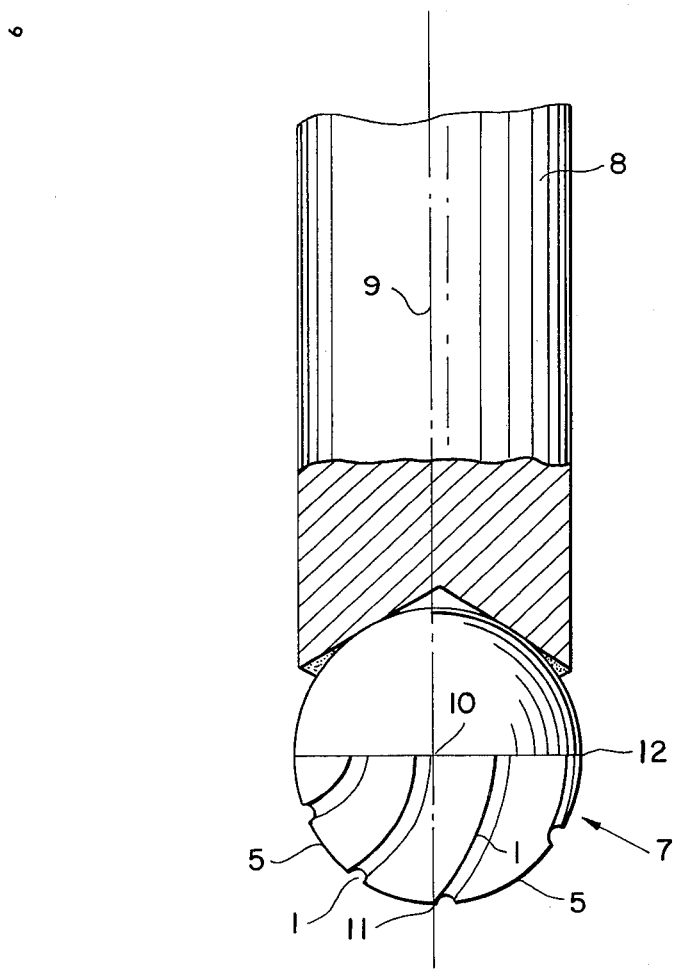

The manufacturing process proposed by the present invention will now be further described hereinbelow with reference to the accompanying drawings wherein FIG. 1 shows a cross-sectional groove shape after an exclusively electrochemical etching process, FIG. 2 shows a cross-sectional groove shape after an electrochemical and subsequent chemical etching process, and FIG. 3 shows a spiral groove bearing having oil grooves in accordance with the present invention.

FIG. 1 illustrates an oil groove 1 in a cross-sectional view thereof, such as will customarily be produced in the gliding surface 5 after an electrochemical etching process. The cross-section of the groove shows at the transition to the bearing gliding surface 5 a sharp-edged transition 4 and in the center of the groove bottom 2 a material bulge or elevation 3. The sharp-edged transition 4 has a positive effect upon the pump output of the oil groove 1, whereas the cross-section-reducing material bulge or elevation 3 at the groove bottom 2 renders the pump effect of the oil groove less effective.

FIG. 2 illustrates the cross-section of the oil groove 1 which has been prepared according to the electrochemical, and subsequent chemical etching process. Due to the chemical etching carried out subsequent to the electrochemical etching, the raised or elevated material collection or mass 3 in the groove bottom 2 is eliminated without an impairment of the sharp-edged transition 4 between the lateral groove surface 6 and the bearing gliding surface 5. The depth of the oil groove 1 is in the range of 1 to 20 microns.

When only the chemical etching process is employed for making the grooves, uneven and partially rounded-off transitions between the lateral groove surface 6 and the bearing gliding surface 5 will be produced, which leads to and results in the undesirable effects mentioned hereinbefore.

FIG. 3 illustrates a ball 7 welded to a shaft 8 so that the extension of the central axis 9 of the shaft passes through the center 10 of the ball 7. The lower hemisphere of the ball 7 is provided with spiral grooves 1 extending from the pole 11 to the equator 12. As clearly shown in FIG. 3, the spiral grooves have a helical configuration. They serve to build up lubricating pressure in conjunction with a cap (not shown). The curved path of the spiral grooves 1 ensures that the lubricant is moved from the equator 12 to the pole 11. The bearing gliding surfaces 5 are located between the spiral grooves 1.

Because of the slight depth of the lubricating grooves 1, i.e., 1 to 20 microns, maintaining an advantageous groove cross-section is absolutely required in order to ensure the proper forwarding of lubricant through the grooves. Disadvantageous cross-sections, and hence poor transmission, causes reduced bearing capacity of the bearings.

It will be obvious to those skilled in the art that many modifications may be made within the scope of the present invention without departing from the spirit thereof, and the invention includes all such modifications.

What is claimed is:

1. A process for producing helical oil grooves in a spherical metallic body, for example for a spiral groove bearing, which comprises exposing a photographic lacquer on the surface of said body to light under a pattern, developing the resulting image, and electrochemically etching and then chemically etching grooves in said body in the non-image areas, whereby pressure-building spiral grooves are produced having a planar groove bottom, straight walls, sharply right-angled edges, and a depth in the range of about 1 to 20 microns.

* * * * *